Figure 1A:
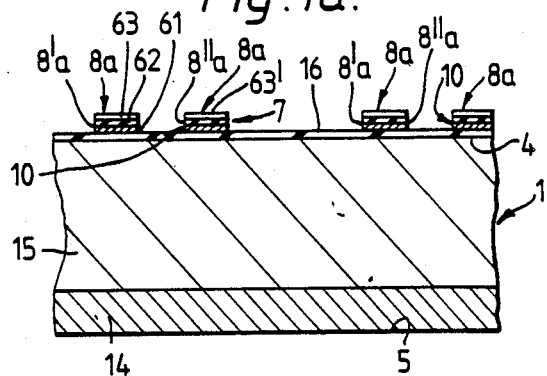

United States Patent [19]

Coe et al.

[11] Patent Number: 4,904,613
[45] Date of Patent: Feb. 27, 1990

[54] METHOD OF MANUFACTURING A DMOS DEVICE

[75] Inventors: David J. Coe, East Grinstead; Kenneth Whight, Partridge Green; Richard J. Tree, Ifield, all of England

[73] Assignee: U.S. Philips Corporation, New York, N.Y.

[21] Appl. No.: 135,880

[22] Filed: Dec. 21, 1987

[30] Foreign Application Priority Data

Dec. 23, 1986 [GB] United Kingdom ............... 8630814

[51] Int. Cl.⁴ .................. H01L 21/22; H01L 21/467
[52] U.S. Cl. ...................................... 437/41; 437/29; 437/40; 437/27; 437/203; 437/228; 437/235; 437/200
[58] Field of Search .............. 357/23.4, 23.8; 437/27, 437/28, 29, 34, 40, 58, 186, 191, 200, 228, 233; 156/643

[56] References Cited

U.S. PATENT DOCUMENTS

| 3,933,541 | 1/1976 | Hagino et al. | 437/225 |
|---|---|---|---|
| 4,038,107 | 7/1977 | Marr et al. | 437/23.4 |
| 4,378,627 | 4/1983 | Jambotkar | 437/41 |
| 4,503,598 | 3/1985 | Vora et al. | 437/41 |
| 4,528,744 | 7/1985 | Shibata | 437/34 |
| 4,561,171 | 12/1985 | Doering et al. | 437/34 |
| 4,587,713 | 5/1986 | Goodman et al. | 437/27 |
| 4,716,126 | 12/1987 | Cogan | 437/29 |

FOREIGN PATENT DOCUMENTS

| 0050773 | 10/1980 | European Pat. Off. | |
| 0182171 | 9/1985 | Japan | 437/41 |
| 0156882 | 7/1986 | Japan | 437/29 |
| 2055247 | 2/1981 | United Kingdom | 437/29 |

Primary Examiner—Brian E. Heaern
Assistant Examiner—T. Thomas
Attorney, Agent, or Firm—Paul R. Miller

[57] ABSTRACT

A method of manufacturing a semiconductor device in which a conductive layer (6) provided on a surface (4) of a semiconductor body (1) is formed with at least one opening (10). The semiconductor device may be an insulated gate field effect transistor (IGFET) in which case the opening (10) defines a hollow gate structure for the IGFET. Insulating material (16') is grown on the surface (4) to cover the conductive layer. The opening or openings (10) are sufficiently small and the growth of insulating material is continued for a sufficiently long period that insulating material growing on edges (8"a) of the conductive layer bounding the openings (10) meets to close the openings so that subsequent etching of the insulating material anisotropically towards the surface (4) to expose a surface of the conductive layer and/or to form a window (18) within insulating material covering an area of the semiconductor body surface larger than the openings and not covered by the conductive layer, leaves insulating material (19,17) on edges of the conductive layer so that the openings remain closed. Where the semiconductor device is an IGFET impurities to form the source and channel regions may be introduced via the window.

8 Claims, 4 Drawing Sheets

METHOD OF MANUFACTURING A DMOS DEVICE

DESCRIPTION

This invention relates to a method of manufacturing a semiconductor device, in particular, but not exclusively, an insulating gate field effect transistor.

Various methods of manufacturing semiconductors are known which comprise providing a conductive layer on a surface of a semiconductor body, the conductive layer being formed with at least one opening and growing insulating material on the one surface to cover the conductive layer. In so far as the manufacture of insulated gate field effect transistors is concerned, a known method comprises providing a conductive gate layer on an insulating layer on one surface of a semiconductor body to form an insulated gate structure having a gate region within which is provided an opening, introducing impurities into the semiconductor body to form a source region of one conductivity type registering with the insulated gate structure and a channel area of the opposite conductivity type underlying the gate region and growing insulating material on the surface to cover the insulated gate structure.

One such method of manufacturing an insulated gate field effect transistor is described in the paper by H. Esaki and O. Ishikawa entitled 'A 900MHz 100W VD-MOSFET with silicide gate self-aligned channel' published in the proceedings of the 1984 IEDM at pages 447 to 450.

The IGFET described in the afore-mentioned paper is of the DMOST type, that is the channel length within the device is accurately defined by double lateral diffusion of different impurities using, as described, the gate layer as a mask. The IGFET is also of the vertical configuration having its source and drain electrodes on opposite major surfaces of the semiconductor body and has an interdigitated source-gate structure. As described in the paper, the center of each gate finger of the interdigitated source-gate structure is removed so as to reduce drain-gate capacitance to enable high power gain at the relatively high frequency of 900MHz referred to in the paper.

European patent application No. EP-A-67475 similarly describes a vertical DMOST in which the centers of the gate fingers may be removed or formed of a more highly resistive material than the edges of the gate fingers so as to reduce gate drain capacitance. As described in EP-A-67475, the gate fingers are defined by a polycrystalline silicon layer of relatively high resistivity and a doping element is diffused laterally into the edges of the layer so as to form more highly conductive strips along the edges of the gate fingers. The central more highly resistive polycrystalline silicon part of each gate finger may be left in place or may be removed by an appropriate etching technique.

According to a first aspect of the present invention, there is provided a method of manufacturing a semiconductor device, which method comprises providing a conductive layer on a surface of a semiconductor body, the conductive layer being formed with at least one opening, and growing insulating material on the surface to cover the conductive layer, characterised by the opening(s) being sufficiently small and the growth of insulating material being continued for a sufficiently long period that insulating material growing on edges of the conductive layer bounding the opening(s) meets to close the opening(s) and etching the insulating material anisotropically towards the surface to expose a surface of the conductive layer and/or to form a window within insulating material covering an area of the semiconductor body surface larger than the opening(s) and not covered by the conductive layer, the anisotropic etching leaving insulating material on edges of the conductive layer so that the opening(s) remain(s) closed.

It should be understood that, as used herein, the term growing includes all methods of providing insulating material on the surface and thus includes, for example, depositing the insulating material on the surface.

Although it is possible that the conductive layer may be provided directly on the semiconductor body surface, for example to form a Schottky contact with the surface, an insulating layer may be provided between the surface and the conductive layer.

The conductive layer may be provided so that the at least one opening is formed within a region of the conductive layer bounded by one or more areas of the semiconductor body surface larger than the opening and not covered by the conductive layer, and the anisotropic etching forms at least one respective window within the insulating material covering each area. The conductive layer may be formed with a plurality of the openings and may be divided into a plurality of regions by areas of the semiconductor body surface larger than the openings, each region containing at least one of the openings. Each region of the conductive layer may be formed with a number of the openings. In each case, the anisotropic etching will open at least one respective window in the insulating material covering each area but each opening will remain closed or covered by insulating material.

Thus by using a method in accordance with the invention, because the opening is sufficiently small and the insulating material is grown for a sufficiently long period that insulating material growing on edges of the conductive layer meets to cover or close the opening(s), insulating material remains to cover that is at least partially to fill, the opening or openings within the conductive layer after the anisotropic etching step. Where the growth of the insulating material is substantially isotropic then growth should be continued until the insulating material forms a layer having a thickness equal to at least half the width of the opening(s). Such a method may find applications in the manufacture of various different types of semiconductor devices. In particular, the use of a method in accordance with the invention, may provide a simple way of passivating the semiconductor body surface within the opening(s). Also, where the opening(s) divide(s) the conductive layer into discrete conductive regions, a method in accordance with the invention may be used to facilitate insulation of the conductive regions from one another enabling separate electrical connection to be made to the conductive regions. S As will be appreciated, the formation of an opening or openings within a conductive layer means that there will normally be steps in the top surface of the semiconductor device at each transition from an edge of the conductive layer to the semiconductor body surfaces. Such steps are undesirable, particularly where metallisation is to be provided over the top surface because the steps may cause weak points in the metallisation. By using a method in accordance with the invention insulating material remains in the opening(s) even after the insulating material has been etched anisotropically to expose the surface of the conductive layer and/or to form a window over an area of the surface of the semiconductor body not covered by the conductive layer and larger than the opening(s). Thus, any steps in the top surface will be reduced and smoothed out if not removed entirely so that the top surface extending over the opening(s) will be flatter than it would have been if the opening(s) were not at least partially filled by insulating material thus reducing the possibility of weak points in metallisation later provided to overlie the top surface to contact the conductive layer and/or the semiconductor surface.

As discussed above windows are formed in the insulating material over each anisotropic etching. The window(s) will normally, but need not necessarily, extend sufficiently through the insulating material to expose the semiconductor body surface but, in any case, the window(s) do enable impurities to be introduced into the semiconductor body. The insulating material remaining on edges of the conductive layer bounding the area(s) defines at least part of the window and the insulating material remaining within the opening(s) shields the underlying part of the semiconductor body from the impurities being D introduced. This enables regions of a given conductivity type to be formed within the semiconductor body registered with edges of the conductive layer bounding the area(s) without unwanted impurities being introduced into the semiconductor body beneath the opening(s). S Furthermore, surfaces exposed by the anisotropic etching can be further treated in other ways without fear of contaminating the semiconductor body beneath the opening(s) so long as the further treatments do not attack and remove the insulating material within the opening(s). For example, metal could be deposited on surfaces exposed by the anisotropic etching and where those surfaces are formed of silicon a refractory metal may be deposited to form self-aligned refractory metal silicide on the exposed silicon surfaces so as to reduce the resistivity of the exposed surfaces.

A method in accordance with the invention may, for example, be D used in the manufacture of charge coupled devices or insulated gate field effect transistors.

In a further aspect, the present invention provides a method of manufacturing an insulated gate field effect transistor, which method comprises providing a conductive gate layer on an insulating layer on a surface of a semiconductor body to form an insulated gate structure having a conductive gate region within which is provided an opening, introducing impurities into the semiconductor body to form a source region of one conductivity type registering with the insulated gate structure and a channel area of the opposite conductivity type underlying the gate region, and growing insulating material on the surface to cover the insulated gate structure, characterised by the opening in the gate region being sufficiently small and the growth of the insulating material being continued for a sufficiently long period that insulating material growing on edges of the conductive gate layer bounding the opening meets to close the opening, by etching the insulating material anisotropically toward the surface of the semiconductor body so that insulating material remains on edges of the insulated gate structure to bound at least part of a window formed within the insulating material by the anisotropic etching and to close the opening within the gate region and by introducing the impurities to form the source region and channel area via the window.

By using a method in accordance with the further aspect of the invention to manufacture an insulated gate field effect transistor insulating material is left in the opening within the gate so as to provide some passivation of the surface.

The insulating material remaining on sides of the insulated gate structure to define at least part of the window also serves to enable registration of the source region and channel area with the insulated gate structure while the insulating material remaining in the opening prevents the surface beneath the opening from being contaminated by the impurities. Thus, an IGFET with a hollow gate structure can be formed without the necessity for a final step of removing a central part of the gate region. Furthermore as the opening within the gate region may be defined at the same time and with the same step as the gate region boundary, tolerance problems may be minimised enabling more precise alignment of the source region and channel area to the hollow gate structure.

The window within the insulating material will normally extend right through the insulating material so as to expose the semiconductor body surface beneath the window. However the impurities to form the source region and channel area may be implanted via a window which does not extend right through the insulating material but which defines a thinner region of insulating material of small enough thickness to enable the desired implantation of impurities but which also provides some protection for the surface.

In an embodiment of the present invention the source region may be formed within a body region of the opposite conductivity type, part of the body region providing the channel area and the method may further comprise shorting the body region to the source region by providing one or more masking regions extending across the window formed by the anisotropic etching so that the masking region(s) and the window define therebetween one or more exposed areas of the source region not covered by either the masking region(s) or the insulating material, etching away the exposed area(s) of the source region to expose an underlying area or areas of the body region, removing the masking region(s) and providing metallisation within the window to short the exposed area(s) of the body region to the source region.

The window may be elongate and the or each masking region may be provided on the insulating material so as to extend completely across the width of the window but only partly across the length of the window.

Thus, the window used for introducing the source region and channel area may also be used for shorting the body region to the source region, insulating material remaining on edges of the insulated gate structure insulating the gate structure from the source region to prevent accidental shorting of the source region to the gate. Such an arrangement enables the alignment tolerances to be reduced both because the same window is used for introducing the impurities and for shorting the source to the body region and because the exposed areas of the body regions may be automatically aligned to the contact windows thus avoiding or at least reducing the alignment problems of the known method discussed above and enabling devices with more reproducible characteristics to be produced.

Where the window is elongated, the masking region(s) may be provided on the insulating layer so as to extend completely across the window in a direction transverse to the length of the window. Generally, the step of providing the masking region(s) comprises providing a respective plurality of substantially mutually parallel spaced apart masking regions extending transversely across the window so as to define a number of spaced-apart exposed areas of the respective source region within the window. Usually, the respective masking regions extending over the window are equally spaced apart in the direction of the length of the window.

The masking regions may be defined by regularly spaced apertures formed in a masking layer, the width of each aperture being larger than the width of the window or may be defined by strips extending across the window or by any other suitable arrangement, it merely being necessary to ensure that in a direction transverse to the window the dimensions of the masking regions and spaces therebetween are sufficient to ensure that the masking regions extend completely across the window where masking is desired and do not extend across the contact window where no masking is desired even when possible misalignment tolerances are taken into account. It will be appreciated that strip-like masking regions extending transversely, in a preferred arrangement perpendicularly, of the window may be particularly advantageous as considerable side ways misalignment between the masking regions and the window may still not affect the positioning of the exposed areas.

The method may further comprise introducing further impurities of the opposite conductivity type through the window after etching to expose the underlying areas of the body regions and prior to removal of the masking regions to increase the surface doping of the exposed body regions prior to providing source metallisation in the window.

The conductive layer may be provided such that the conductive region is elongated and the opening extends along the length of the conductive region to form two conductive region strips, the anisotropic etching of the insulating material defining a respective window on each elongated side of the gate region and impurities being introduced into the semiconductor body to form a respective source region aligned with each elongated edge of the gate region and a respective channel area underlying each gate region strip. Where the semiconductor device is an IGFET, the conductive gate region may form a single cell of the IGFET with the two adjacent source regions, underlying channel areas and an associated drain region. The IGFET may consist of many such cells having a common drain region disposed adjacent a surface of the semiconductor body opposite the surface. In such an arrangement, the gate layer may consist of spaced-apart elongated gate regions interconnected by transversely extending conductive strips provided by the conductive layer so that, after the anisotropic etching, insulating material remaining on edges of the conductive layer defines windows for introducing the impurities to form the source regions and channel areas, each window being bounded by insulating material left on opposed edges of two adjacent gate regions and two adjacent conductive strips.

Depending upon the manner in which the insulating material is grown, the anisotropic etching may expose the surface of the conductive layer. Metal may be deposited on surfaces exposed by the anisotropic etching, for example where the semiconductor body is formed of silicon and at least the top surface of the gate layer is formed of polycrystalline silicon, then a refractory metal may be deposited on the exposed surfaces and annealed to form a self-aligned refractory metal silicide on the gate and the exposed area of the source region. Where the source region is shorted to the underlying body region as discussed above, the conductive gate layer will normally be protected by an etch resistant layer, for example a silicon nitride layer, during the etching step to expose the p body region. The silicon nitride and any other insulating layer may then be removed to expose the conductive gate layer for silicidation after the etching to expose areas of the body region. The silicidation may be provided in addition to or in replacement of further doping of the exposed body region.

Of course, the window(s) need not necessarily expose the D surface of the semiconductor body and the anisotropic etching may result in only the gate layer surface being exposed for silicidation. Alternatively, where the gate is a polycrystalline silicon gate formed on a silicon body the insulating material may be grown by a method, for example wet oxidation, which results in thicker insulating material over the gate so that only the area of the semiconductor body surface within the window is exposed for silicidation.

Figure 2:
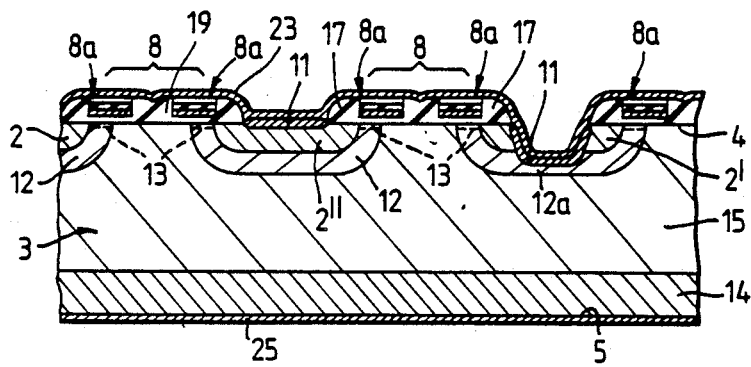
Figure 3:
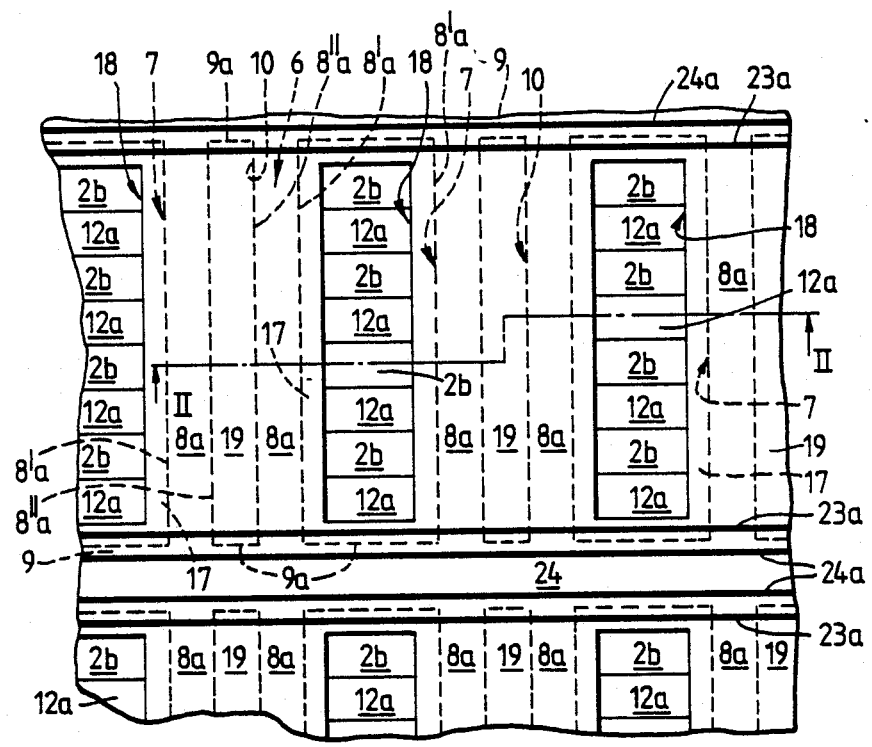

It should be noted that European patent application No. EP-A-54259 describes a method of manufacturing an insulated gate field effect transistor of the D lateral type (that is with the source and drain regions adjacent the same surface of the semiconductor body) in which insulating material covering a surface of a silicon body carrying an insulated polycrystalline silicon gate is etched anisotropically to define with field oxide on the surface a window on either side of the gate for introducing impurities to form a source and a drain region on respective sides of the gate. Refractory metal is deposited on surfaces exposed by the anisotropic etching (which may or may not include the surface of the gate) in such a manner so as to form either a metal layer or a refractory metal silicide self-aligned to the gate. In order that the invention may be more readily understood, embodiments thereof will now be described, by way of example, with reference to the accompanying drawings, in which:

FIGS. 1a to 1e are schematic cross-sectional views illustrating, in sequence, various steps of a method in accordance with the invention for manufacturing an insulated gate field effect transistor;

FIG. 2 is a schematic cross-sectional view taken along the line II—II in FIG. 3 illustrating part of an insulated gate field effect transistor manufactured by a method in accordance with the invention; and FIG. 3 is a schematic top plan view illustrating part of the insulated field effect transistor shown in FIG. 2. It should of course be appreciated that the various figures are not drawn to scale and that, moreover, in the interests of clarity the dimensions of parts of the figures may have been enlarged or reduced.

Referring first to FIGS. 2 and 3, there is illustrated part of an insulated gate field effect transistor (IGFET) manufactured by a method in accordance with the invention.

The IGFET shown in FIGS. 2 and 3 is a vertical DMOS transistor (DMOST) having an interdigitated structure suitable for use at high frequencies, for example UHF frequencies, typically in the range of 1GHz (Gigahertz). The DMOST is considered to be of vertical configuration because, as shown in FIG. 2, a semiconductor body 1 of the DMOST has source and drain regions 2 and 3 disposed at respective ones of two opposed major surfaces 4 and 5 of the semiconductor body so that, in operation of the device, current flows between the two opposed major surfaces 4 and 5.

A gate layer 6 of the IGFET has regularly arranged apertures 7 which, as shown, are rectangular and define parallel spaced-apart rectangular gate fingers or regions 8 connected by transversely extending conductive strips or bus bars 9. Each gate finger 8 is formed with a central rectangular opening 10 which extends along the length of the gate finger 8 dividing it into two gate finger strips 8a. Thus, together with edges 9a of the associated transversely extending bus bars 9, outer edges 8'a of the gate finger strips 8a define the apertures 7 while inner edges 8"a of the gate finger strips define the openings 10.

It should of course be appreciated that although a rectangular geometry has been shown for the gate layer 6, any other suitable geometry could be used, depending upon the desired source region geometry.

In the arrangement shown in FIGS. 2 and 3, a number of source regions 2 are provided adjacent the major surface 4 while only a single drain region 3, common to all the source regions 2, is provided adjacent the major surface 5.

As mentioned above the IGFET is a DMOST, that is an IGFET in which the channel length is accurately defined by double lateral diffusion of different impurities in the semiconductor body. Thus by introducing impurities via the apertures 7 in the gate layer as will be described hereinafter the gate layer is used as a mask and each source region 2 is formed within a respective body region 12 of the opposite conductivity type so that the boundary of each source region 2 is aligned with edges of the associated aperture and part of the associated body region underlies each of the same two gate finger strips 8a to form respective channel areas 13 under each gate finger strip 8a each channel area 13 extending between a respective source region 2 and the drain region 3. As will be appreciated from FIGS. 1c and 2, in particular, each source region 2 is associated with two different channel areas 13 and therefore two different gate fingers 8. Adjacent source regions, for example source regions 2' and 2" in FIG. 2, form with the gate finger 8 and underlying channel areas 13 disposed between the source and drain regions a cell of the IGFET so that at the periphery of the active area of the device, each source region 2 is common to two cells of the IGFET. Typically the IGFET will have hundreds of such cells. As shown, the cells are of rectangular configuration although, of course, any suitable geometry could be used.

As will be discussed in greater detail hereinafter openings 2a are provided in the source regions 2 to expose areas 12a of the body regions 12 so that each source region is shorted to the associated body region by the later applied source metallisation. A method embodying the invention for manufacturing the IGFET shown in FIGS. 2 and 3 will now be described and further features of the IGFET will become apparent from the following description.

The semiconductor body 1 comprises an n+ conductivity type monocrystalline silicon substrate 14 on which is grown epitaxially a more highly resistive n conductivity type monocrystalline silicon layer 15. Typically the substrate 14 may have a resisitivity of $10^{-3}$ ohm cm and a thickness of 250 micrometers while the epitaxial layer 15 may have a resistivity of 1 ohm cm and a thickness of 8 micrometers.

An oxide layer 16 (FIG. 1a) typically of 0.07 micrometers thickness is grown on the surface 4 of the layer 15 by conventional thermal techniques and a gate layer 6 is then deposited on the oxide layer 16. In this particular example, the gate layer 6 has a composite layer structure. Thus, a polycrystalline silicon layer 61 is deposited on the oxide layer 16 followed by an insulating layer 62, for example a silicon dioxide layer and then an etch-resistant layer 63 of, for example, silicon nitride. Using conventional masking and etching techniques unwanted parts of the composite gate layer 6 are removed so as to form the hollow gate fingers 8 interconnected by the bus bars 9 (FIGS. 2 and 3).

In order to provide the required low resistivity, the polycrystalline silicon gate layer 61 is doped with, for example, boron or phosphorus. Although the layer 61 may be deposited as a doped layer, doping may be carried out after deposition and patterning of the gate layer 6. For example, the doping of the gate layer 6 may occur during formation of the source and body regions 2 and 12 or may be by lateral diffusion of, for example, boron into exposed edges of the patterned gate layer as described in EP-A-67475. In the latter case, the openings 10 in the gate fingers 8 will normally (but not necessarily) be formed after doping of the patterned gate layer 6 as described in EP-A-67475.

Of course, the gate layer 61 need not necessarily be a polycrystalline silicon layer but could be any suitable conductive layer, for example a refractory metal layer, a refractory metal silicide layer (for example a platinum silicide layer) deposited on the oxide layer 16 or a composite of two or more of the above mentioned materials.

After the gate layer 6 has been formed, insulating material 16', for example silicon dioxide is deposited on the surface 4 by an appropriate vapour deposition technique.

The insulating material grows on all exposed surface, that is the surface 4, where exposed, the surface 63' of the gate layer and edges 9a and 8'a and 8"a of the gate layer 6.

The separation of the two gate finger strips 8a of each gate finger is sufficiently small and the period for which insulating material is deposited is sufficiently long that insulating material growing on the edges 8"a of the gate finger strips 8a laterally of the elongated gate fingers 8 (that is across the surface 4) meets or merges to cover completely the openings 10.

It will of course be appreciated that the meeting or merging of the insulating material growing on the edges 8"a does not depend merely on the separation of the edges 8"a within a gate finger 8 that is the width of the openings 10 but depends on the thickness of insulating material grown on the edges 8"a. Where the thickness of the composite gate layer 6 is comparable to the width of the openings 10 and the growth of the insulating material is substantially isotropic (that is the insulating material grows to substantially the same thickness on the edges 8'a and 8"a of the gate layer as on the surface 63' of the gate layer, then the insulating material should be grown for sufficient time to have a thickness of at least half the width of the openings 10 so that the insulating material growing laterally of opposed gate edges 8"a meets to close or cover the openings 10. However, for practical purposes, the width of the openings 10 should be sufficiently small to ensure that only a reasonable thickness of insulating material growing on the edges 8"a is required to fill the openings 10 since too thick a layer of insulating material could place undue strain on the semiconductor body and would, moreover, as will be appreciated from the following description, make the subsequent etching process rather time consuming.

Figure 1B:
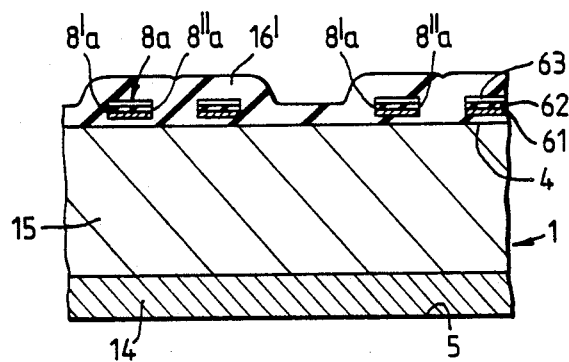

In the particular example being described, the gate fingers 8 may have a width of 3 micrometers and be separated by apertures 7 of the same width while the central openings 10, within the gate fingers may have a width of one micrometer to define two gate finger strips 8a each one micrometer wide. With such dimensions, then if the growth of the insulating material were perfectly isotropic continuing growth until a thickness of just over 0.5 micrometers would be sufficient to ensure that the openings 10 were covered by the meeting or merging insulating material growing laterally of the gate finger strips 8a. However as the growth of the insulating material may not be perfectly anisotropic but may for example be smaller on the upstanding edges 9a, 8'a and 8"a of the conductive gate layer 6 than on the surface 63' of the gate layer 6, growth should be continued for a short period after a thickness of 5 micrometers has been reached to ensure that the openings 10 are completely covered by the laterally growing insulating material. FIG. 1b illustrates schematically the thickness of the insulating material when growth is stopped.

Figure 1C:
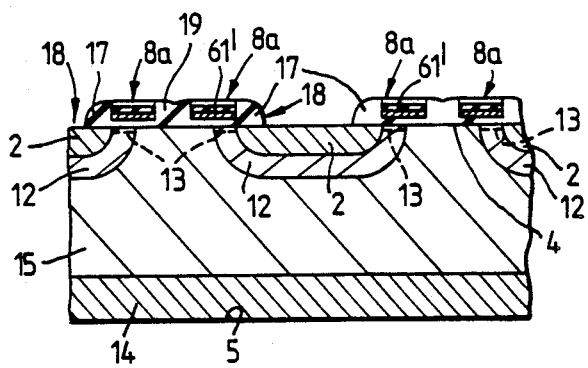
Figure 1D:
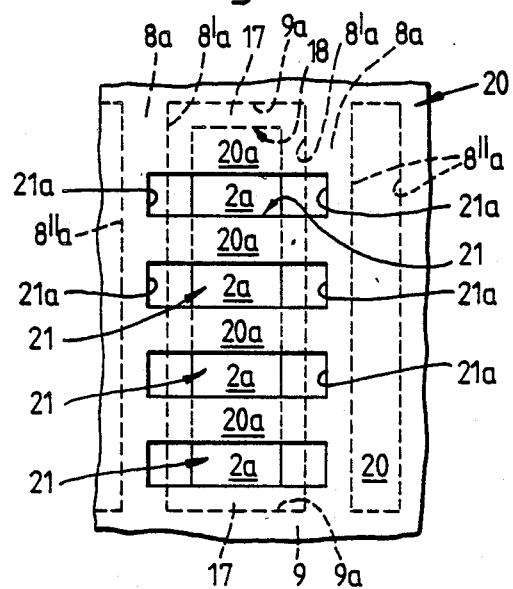
Figure 1E:
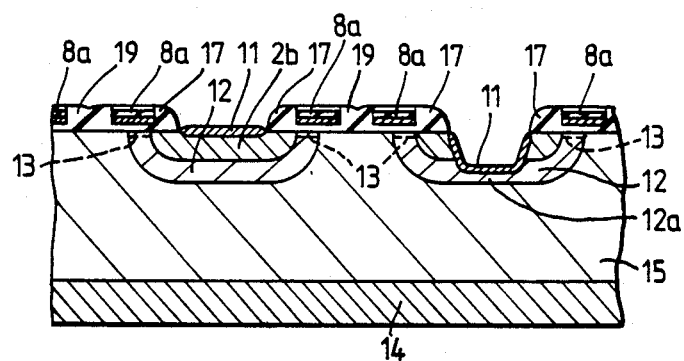

When the growth of the insulating material is stopped, the SD insulating material is etched anisotropically toward the surface 4 using, for example, a reactive ion etching technique, such as a $CHF_3$ and Argon gas mixture to expose the surface 4 beneath the apertures 7 in the gate layer 6 and the surface 63' of the composite gate layer 6. As the anisotropic etching attacks the insulating material in a direction normal to the surface 4, a given vertical thickness of insulating material is removed. Thus when the surface 4 within the apertures 7 and the surface 63' of the gate layer 6 are exposed by the anisotropic etching, fillets 17 of insulating material of the original laterally grown thickness remain on the edges 9a, 8'a of the gate layer 6 so defining a respective window 18 in the insulating material disposed above and within each aperture 7. As the growth of insulating material was continued so that insulating material growing laterally of the edges 8"a of each gate finger 8 met to cover the openings 10, the anisotropic etching does not expose the surface 4 within the openings 10 but leaves a thickness of insulating material 19 extending to the level of the surface 63' so providing a substantially flat surface between and over the two gate finger strips 8a of each gate finger 8. FIG. 1c illustrates schematically a semiconductor body on which the anisotropic etching step has just been completed.

Impurities are then introduced into the semiconductor body via the windows 18 to form the body regions 12 and source regions 2. Thus, in one example, boron ions are implanted via the windows 18 using, for example, a dose of $10^{13} cm^{-2}$ and an energy of 150keV followed by a drive-in at 1050 degrees Celsius for 30 minutes. A second ion implantation step through the windows 18 using phosphorous ions at an energy of 50keV and a dose of $10^{15} cm^{-2}$ is then carried out followed by an annealing step, for example ten minutes at 1000 degrees Celsius. Thus p-type body regions 12 and n-type source regions 2 are formed, with the length of the channel areas being determined by the difference in the lateral diffusion lengths of the n-type and p-type dopants under the above conditions. Knowing the diffusion lengths of the dopants under the particular conditions used, the thickness of the insulating material fillets 17 can be selected so that the source regions 2 are aligned, as shown in FIG. 1c, to the edges 8'a of the gate fingers 8. The channel areas 13 may be aligned with the edges 8"a of the gate fingers 8 or, alternatively as shown, the gate finger strips 8a may extend laterally toward one another beyond the channel areas 13 so as to provide a field plating effect. The source and body regions may be formed so as to extend, respectively, to a depth of 0.5 and 1.0 micrometers below the surface 4.

The insulating material covering the openings 10 prevents dopants from being introduced into the semiconductor body beneath the openings 10 during formation of the source regions 2 to enable the hollow gate structure to be provided prior to formation of the source and body regions 2 and 12.

Although as described above, the source and body regions 2 and 12 are formed by ion implantation another suitable process, for example a diffusion process, could be used where the windows 18 expose the surface 4.

After formation of the source and body regions 2 and 12, a suitable resist layer 20 is then applied (FIG. 1d) to the surface of the insulating material and is patterned using conventional techniques to define apertures 21 in the resist layer so that masking regions 20a of the resist layer 20 extend completely across the windows 18 in the insulating material.

Each window 18 is associated with one or more masking regions 20a so that the window 18 and associated masking region(s) 20a together define one or more exposed areas 2a of the associated source region 2, that is areas 2a of the source region 2 not covered by either the masking region(s) or the insulating material within which the window 18 is defined. The exposed area(s) 2a within each window 18 are thus not defined merely by the masking region(s) 20a but by the combination of the masking region(s) 20a and the windows 18. As shown, the masking region(s) 20a define(s) one dimension of the exposed area(s) 2a and the contact window 18 defines the other dimension of the exposed area(s) 2a.

Although any desired suitable shape could be used for the apertures 21, as shown each aperture 21 is rectangular to fit with the rectangular pattern adopted for the windows 18 and gate layer 6. The dimension or width of each aperture 21 in a direction transverse (in the example shown, perpendicular) to the length of i the associated window 18 is greater, usually by at least two times the maximum misalignment error which could occur, than the width of the window 18 so that, even when possible misalignment errors are taken into account, edges 21a of the apertures 21 extending longitudinally of the associated window 18 do not overlap the elongated edges 18a of the window.

Alternatively, the resist layer 20 may be formed as a series of discrete strips extending transversely, in the example shown perpendicularly, of the windows 18 so as to reduce even further the possibility of the resist layer overlapping the longitudinal edges of the contact window except in places where the resist layer extends completely across the contact windows.

Thus, the resist layer 20 only covers the parts of the windows 18 which it is desired to mask and where the resist layer does cover part of a window 18 the resist layer extends completely across the width of the window 18. The resist layer should extend transversely beyond the contact window on each side for a distance equal to at least the maximum tolerance error which could be expected.

Within each window 18, the relative sizes of the exposed source areas 2a and the unexposed source areas 2b covered by the resist masking regions 20a may be in any desired ratio. In the arrangement shown, the resist layer 20 is selected so as to provide alternate exposed and covered equal area areas 2a and 2b of the source region. It should of course be appreciated that the exposed and covered areas 2a and 2b may have any desired shape. The number of exposed and covered areas will depend upon the particular device and the length of the gate fingers 8, the latter being determined by the desired gate RC time constant.

Using conventional etching processes the exposed areas 2a of the source regions are then removed so as to expose the underlying areas 12a of the p-type body regions 12. The resist layer 20 is then removed.

After formation of the source and drain regions 2 and 12 and exposure of the body areas 12 as described above, a refractory metal silicide layer 11 may be formed on the exposed areas of the surface 4 of the silicon body. The gate layer 61 may also be exposed using an appropriate etchant to remove the silicon nitride layer 63 and insulating layer 62 for subsequent silicidation. In such an arrangement it would also be necessary to provide fresh insulating material over the silicided gate layer to prevent shorting to and to reduce the capacitance with the subsequent source metallisation. The metal silicide layer 11 may be formed in a known manner by depositing a refractory metal, for example tungsten, molybdenum, platinum or titanium, on the semiconductor body and then annealing, for example thermally or by use of a laser beam, so as to form refractory metal silicide only over the exposed areas of the silicon surfaces. Metal remaining on the insulating material is removed by an appropriate method, for example an acid treatment.

Although the method of shorting the p body regions 12 to the source regions 2 described above is particularly advantageous, alternative methods could be used. Thus, for example, after implanting of the impurities via the windows 18 to form the p body regions 12 and the source regions 2, an appropriate masking layer (similar to the layer 20) may be provided over the insulating material so as to protect the areas 2b of the source regions from a subsequent p-type overdoping implantation to form p+ conductivity type areas 12a of the p body regions 12 extending to the surface. Thus, after the implantation steps, alternate source and body regions 2b and 12a are provided at the surface 4. It is possible, in such a case, for the refractory metal silicide to be formed prior to the formation of the source and drain regions, the necessary impurities being implanted through the refractory metal silicide. A technique using interface mixing with an ion beam can be used to enhance silicide formation. As group III or IV dopants may be used as the ion beam, the silicide formation and doping of the underlying silicon to form the source and body regions can be carried out simultaneously with the silicide formation on the exposed silicon surfaces. When such a method is used, the refractory metal silicide layer may of course be formed after, with or before the source and body regions 2 and 12.

In an alternative arrangement, the source regions 2b may be implanted through a mask similar to the mask 20 to provide alternate source and drain regions. Such an arrangement will, of course, however result in a shorter channel length.

Where no etching step is carried out to short the p body 12 to the source region 2, then the surface 61' of the conductive gate layer 61 may be exposed during the anisotropic etching. Indeed in such an arrangement, there would be no necessity for the conductive gate layer 61 to be protected and the layers 62 and 63 could be omitted. However, in such an arrangement, the exposed surface of the conductive gate layer 61 would, of course, have to be covered by a subsequent growth of insulating material through an appropriate mask to prevent shorting to subsequent overlying source metallisation. Where the upper layer of the conductive gate layer 61 was formed of polycrystalline silicon, a self-aligned refractory metal silicide can be formed on the exposed surface 61'.

Although in the method described above the insulating material is formed by an appropriate vapour deposition technique, the insulating material may, for example where the gate layer is formed of polycrystalline silicon, be grown by oxidising the silicon surface 4 and the gate layer 6.

When the body source regions and body regions 2 and 12 and metal silicide (if required) have been formed as described above, then metallisation can be deposited on the surface 4 to form the source and gate metallisation. Of course, where the gate layer surface 61' has been exposed for the purposes of silicidation insulating material will be deposited over the exposed silicided gate layer surface 61' using an appropriate mask prior to depositing the metallisation so as to prevent shorting of the gate to the source. Windows will of course be formed in the insulating material to enable the metallisation to contact the bus bars 9. After the metallisation has been deposited on the insulating material to contact the bus bars 9 and to short the p body regions 12 to the source regions 2, known resist masking and etching techniques are used to define separate source metallisation 23 and bus bar or gate metallisation 24. Although in the interests of clarity the source metallisation is omitted in FIG. 3, the edges of the source metallisation which of course extends over the windows 18 is illustrated by the thick lines 23a in FIG. 3, the edges of the bus bar metallisation similarly being defined by the thick lines 24a. The source metallisation 23 thus shorts the exposed p body regions to the exposed source regions 2a within each window 18.

The drain of the transistor is formed by the n-type substrate 3 and an electrode 25 is provided on the free surface 45 of the substrate 3 to form the drain contact. The electrode may be, for example, gold-antimony which is deposited in a known manner.

As will be appreciated from the above, the method described enables a particularly compact structure to be provided. In particular, a hollow gate structure can be provided so as to reduce gate-drain capacitance in a manner which enables the source and drain regions to be self-aligned to the hollow gate structure. As the hollow gate structure is provided before and not after the introduction of the impurities to form the body and source regions, the possibility of misaligning the central aperture in the gate fingers with respect to the source and body regions is removed or at least minimised to enable alignment tolerances to be minimised.

Further, by using anisotropic etching to define the windows for introducing the impurities to define the source and body regions, the source and body regions may be self-aligned to the gate structure. Also since the same window can be used for any silicidation step and for the contact windows for the source metallisation alignment tolerances can be further minimised.

It should of course be appreciated that the method described above may be suitable for manufacturing semiconductor devices other than vertical IGFETS. In particular the method by which the insulating material is grown and then anisotropically etched to leave insulating material filling gaps between the conductive gate finger strips 8a of a gate finger could be applied to other conductive layers provided on semiconductor bodies or substrates, for example the electrodes of a charge-coupled device.

The invention may, of course, be applicable to semiconductor devices made from materials other than silicon. Also, although the invention finds particular application in relation to IGFETs with interdigitated structures it may be applicable in relation to other cellular structures. As will be appreciated, the conductivity types of the various regions of the IGFETs described above could be reversed.

From reading the present disclosure, other modifications will be apparent to persons skilled in the semiconductor art for example persons skilled in the design, manufacture and/or use of semiconductor devices. Although claims have been formulated in this application to particular combinations of features, it should be understood that the scope of the disclosure of the present application also includes any novel feature or novel combination of features disclosed herein either explicitly or implicitly or any generalisation or modification of that feature or of one or more of those features which would be obvious to persons skilled in the art, whether or not it relates to the same invention as presently claimed in any claim. The applicants hereby give notice that new claims to such features and/or combinations of such features may be formulated during the prosecution of the present application or of any further application derived therefrom.

We claim:

1. A method of manufacturing gas field effect transistor comprising the steps of:
   (a) forming an insulating layer on a surface of a semiconductor body,
   (b) forming at least one insulated gate structure on said insulating layer by providing separated conductive gate regions on said insulating layer,
   (c) forming an opening through each of said conductive gate regions to said insulating layer, said opening being smaller than separation of said separated conductive gate regions,
   (d) growing insulating material on said separated conductive gate regions for a period sufficient to close said opening through each of said conductive gate regions, said insulating material also being grown on said insulating layer between said separated conductive gate regions,
   (e) anisotropically etching said insulating material toward said surface of said semiconductor body until said surface is exposed between said separated conductive gate regions, but insulating material remains on edges of said conductive gate regions and said openings remain closed, said insulating material remaining on said edges forming at least in part at least one window through said insulating material to said surface.
   (f) introducing impurities through said at least one window to form source regions registered with said insulated gate regions, said source regions being of one conductivity type, and to form channel regions of an opposite conductivity type beneath said insulated gate regions.

2. A method according to claim 1, wherein said source regions are formed in regions of said semiconductor body of said opposite conductivity type, and wherein a portion of said body provides said channel regions, further comprising the steps of shorting a region of said semiconductor body to said source regions by
   (g) providing at least one masking region extending across said at least one window to expose at least one area of said source regions,
   (h) etching away the exposed areas of said source regions to expose portions of said semiconductor body,
   (i) removing said at least one masking region, and
   (j) providing metallization in said at least one window to short exposed portions of said semiconductor body to said source regions.

3. A method according to claim 2, wherein said at least one window is elongated, and wherein said at least one masking region extends completely across a width dimensions of said at least one window but only partly across a length dimension of said at least one window.

4. A method according to claim 3, wherein said conductive gate regions are formed elongated, wherein said opening extends in the length direction of said conductive gate region to form two conductive gate regions strips, wherein said at least one window is formed along said elongated length of said conductive gate regions, and wherein said step of introducing impurities forms respective source regions aligned with each elongated edge of said gate regions, said channel regions being formed respectively underlying each conductive gate region strip.

5. A method according to claim 1, wherein said step of anisotropically etching exposes upper surfaces of said conductive gate regions.

6. A method according to claim 1, further comprising the step of depositing metal on surfaces exposed by said step of anisotropically etching, wherein said metal reduces resistivity of said exposed surfaces.

7. A method according to claim 1, wherein said at least one of said surface of said semiconductor body and said conductive gate regions are formed of silicon, and wherein refractory metal silicides are formed on surfaces exposed by said step of anisotropically etching.

8. A method according to claim 1, wherein said conductive gate regions are formed elongated, wherein said opening extends in the length direction of said conductive gate region to form two conductive gate region strips, wherein said at least one window is formed along said elongated length of said conductive gate regions, and wherein said step of introducing impurities forms respective source regions aligned with each elongated edge of said gate regions, said channel regions being formed respectively underlying each conductive gate region strip.

* * * * *